United States Patent
Schuegraf et al.

(10) Patent No.: US 6,746,928 B1
(45) Date of Patent: Jun. 8, 2004

(54) METHOD FOR OPENING A SEMICONDUCTOR REGION FOR FABRICATING AN HBT

(75) Inventors: Klaus F. Schuegraf, Aliso Viejo, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/851,228

(22) Filed: May 8, 2001

(51) Int. Cl.[7] .................... H01L 32/331; H01L 21/8222
(52) U.S. Cl. .................. 438/314; 438/59; 438/170; 438/197; 438/235; 438/258; 438/309; 438/312; 438/313; 438/320; 438/326; 438/694
(58) Field of Search .................. 438/314, 59, 170, 438/197, 235, 258, 309, 312, 313, 320, 326, 694

(56) References Cited

U.S. PATENT DOCUMENTS 5,899,747 A * 5/1999 Wu et al. .................. 438/704
5,912,479 A * 6/1999 Mori et al. ............... 257/192
6,169,007 B1 * 1/2001 Pinter ....................... 438/320

OTHER PUBLICATIONS

Moreau, Semiconductor Lithography, Principles, Practices and Materials, Plenum, 1998. p. 633–4 & Figure 13–1–5.*
S. A. St. Onge et al., "A 0.24 um SiGe BiCMOS Mixed–Signal RF Production Technology Featuring a 47 GHz $f_t$ HBT and 0.18 um $L_{eff}$ CMOS," IEEE BCTM 7.2, 1999, pp. 117–118.

J. B. Johnson et al., A Technology Simulation Methodology for AC–Performance Optimization of SiGe HBTs, IEEE IEDM, 2001, pp. 21.4.1–21.4.4.

G. Freeman et al., "A 0.18 um 90 GHz $f_T$ SiGe HBT BiCMOS, ASIC–Compatible, Copper Interconnect Technology for RF and Microwave Applications," IEEE IEDM, 1999, pp. 22.5.1–22.5.4.

* cited by examiner

Primary Examiner—Michael S. Lebentritt
Assistant Examiner—Michael K. Luhrs
(74) Attorney, Agent, or Firm—Farjami & Farjami LLP

(57) ABSTRACT

According to one disclosed embodiment, a transistor gate is fabricated on a substrate. For example, the gate can be a polycrystalline silicon gate in a FET. Thereafter, a conformal layer is deposited over the substrate and the gate and is then etched back to form spacers on the sides of the gate. An underlying dielectric layer is formed on the substrate, gate, and spacers. The conformal layer and the underlying dielectric layer can be comprised of, for example, a dielectric such as silicon dioxide, silicon nitride, or a low-k dielectric. Next, an overcoat layer is fabricated on the underlying dielectric layer. The overcoat layer can be, for example, polycrystalline silicon. Following, an opening is etched in the overcoat layer and the underlying dielectric layer wherein subsequent films can be grown. For example, silicon germanium can be grown in the opening for fabrication of a silicon germanium heterojunction bipolar transistor.

30 Claims, 10 Drawing Sheets

METHOD FOR OPENING A SEMICONDUCTOR REGION FOR FABRICATING AN HBT

BACKGROUND OF THE INVENTION

1. Field of the Invention

The present invention is generally in the field of fabrication of semiconductor devices. More specifically, the invention is in the field of fabrication of various layers related to HBT transistors in semiconductor devices.

2. Related Art

A technique often employed in the fabrication process for semiconductor devices involves creating an opening in a certain region of various layers or the substrate in the semiconductor device in order to deposit or grow other materials in the opening. For example, one of the steps in constructing a silicon germanium heterojunction bipolar transistor ("SiGe HBT") requires opening a targeted region in a layer of oxide and growing a film of SiGe in the opening to serve as the transistor base. Conventional methods for creating such an opening have proven less than satisfactory.

FIG. 1 depicts structure 10 which is used to illustrate problems associated with depositing a relatively thick film over the semiconductor substrate and opening a certain region in the film. In this example, creation of an opening is needed so that SiGe can be grown in the opening to complete fabrication of an NPN HBT transistor. Certain details and features have been left out of FIG. 1 which are apparent to a person of ordinary skill in the art. Structure 10 includes components of a field effect transistor ("FET"), in this instance a P-channel field effect transistor ("PFET"), and a NPN HBT that are still under construction.

As seen in FIG. 1, structure 10 includes collector 12 for a SiGe NPN HBT. Collector 12 has top surface 14. Buried layer 16, which is composed of N+type material, is formed in silicon substrate 17 in a manner known in the art. Collector sinker 18, also composed of N+type material, is fonned by diffusion of heavily concentrated dopants from the surface of collector sinker 1 8 down to buried layer 16. Deep trench structures 22 and field oxide structures 24, 25, 26, and 28, composed of silicon dioxide ("SiO$_2$") material. are formed in a manner known in the art. Deep trench structures 22 and field oxide structures 24, 25, 26, and 28 provide electrical isolation from other devices on silicon substrate 17 in a manner known in the art.

Structure 10 of FIG. 1 also includes features and components of a CMOS device, such as a P-channel field effect transistor, or PFET, on the same wafer as the NPN HBT. Structure 10 includes N well 32 for a PFET. Structure 10 further includes source 34 and drain 35. Structure 10 also includes gate oxide 36 and gate 38, which in this example is polycrystalline silicon. Both gate oxide 36 and gate 38 are formed in a manner known in the art.

It is additionally seen in FIG. 1 that thick conformal layer 42 is deposited on the semiconductor surface, and additional conformal overcoat layer 44 is deposited on thick conformal layer 42. Conformal layer 42 can be a dielectric material known to those skilled in the art and may be, for example, SiO$_2$ or silicon nitride. Overcoat layer 44 can consist of, for example, polycrystalline silicon. Opening 45 with width 48 is the result of an etching process that etches thick conformal layer 42 and overcoat layer 44 selectively down to top surface 14. Etching can be done by a method known in the art such as a hydrogen fluoride ("HF") wet etch. Some problems with this approach are that HF is an isotropic etcher, i.e. it etches in all diireections, and further a lengthy etch time is required to etch through thick conformal layer 42. These problems cause undercutting in thick conformal layer 42. These problems and the resulting undercutting they produce leave width 48 of opening 45 uncertain, and most often, larger than intended.

Continuing with FIG. 1, the uncertainty in size of width 48 of opening 45 create by the undercutting of thick conformal layer 42 means that any subsequent film deposited in opening 45 will be of indeterminate dimensions. An example would be the epitaxial growth of SiGe film 46 in opening 45 to serve as the base for an HBT. Undercuts 47 result in lack of control of critical physical dimensions in the SiGe HBT. such lack of control in turn results in undesirable electrical properties. For example, for certain applications, the base-collector parasitic capacitance can be undesirably increased. As another example, in certain applications control over precise dimensions of the SiGe HBT base can be impaired. Whenever there is imprecision in building the SiGe HBT. performance is compromised. Thus, when undercutting occurs from the etching step such that the dimensions of width 48 of opening 45 are uncertain the SiGe HBT will not perform optimally. Another problem caused by the undercutting is the difficulty in trying to implant, for example, dopants in certain regions of the deposited film that are obscured by the undercut.

Creating an opening in a relatively thin layer of material does not present the level of undercutting associated with creating an opening in a relatively thick layer. For example, when an opening is needed in a thin layer of a-dielectric film, the etch time necessary to etch through the relatively thin dielectric layer is comparatively brief, and the short etch time keeps undercutting to a minimum. Unfortunately, a different problem arises with thin layers. FIG. 2 shows the difficulties encountered with having to create an opening in a thin conformal film. Structure 20 of FIG. 2 is similar to structure 10 of FIG. 1 and has the same device components that make up structure 10 in FIG. 1. In addition, thin conformal film 52 is deposited over silicon substrate 17 and its various regions such as the field oxide regions. and forms a thin conformal film. Conformal overcoat 54 is deposited on thin conformal film 52. Opening 55 with width 58 has been etched through overcoat 54 and thin conformal film 52, down to top surface 14 in a manner known in the art.

The etch time necessary to etch through thin conformal film 52 is relatively short, and minimal undercutting occurs. The significant reduction in undercutting means that the dimensions of width 58 of opening 55 can be controlled with greater precision, and any subsequent material deposited in opening 55 will have dimensions that are better controlled. FIG. 2 further has SiGe film 56 grown over thin conformal layer 52 and conformal overcoat 54. It is seen that SiGe film 56 also grows in opening 55 where it assumes width 58. In the present example, control of the dimensions of the grown SiGe layer is critical to the performance of the HBT. Because undercutting of conformal layer 52 is minimal, the dimensions of SiGe film 56 grown in and close to opening 55 can be controlled much more precisely. When creating an opening in a relatively thin film, the uncertainty in the dimensions of subsequent materials deposited or grown in the opening created in a thick layer is avoided.

While creating an opening in thin conformal layer 52 causes minimal undercutting, FIG. 2 shows that other problems develop with this process. Because of the relative thinness of thin conformal film 52 where it deposits on gate 38, the subsequent depositing of conformal overcoat 54 at gate 38 produces a sharp edge or cusp at the upper coerners of gate 38. It is seen in FIG. 2 that the: growth of SiGe film 56 on gate 38 is non-conformal and produces a non-ideal property of deposition. This non-ideal property of deposition is also referred to as non-isotropic deposition. In the present example, the non-isotropic deposition of SiGe leads to a phenomenon called "breadloafing". Breadloafing occurs where the non-conformal film, in this case SiGe film 56, wraps around the sharp edges of conformal overcoat 54 at the upper corners of gate 38, and extends beyond the upper corners of gate 38, producing a profile resembling a slice of bread.

Continuing with FIG. 2, overhangs 57 characterize breadloafing and create crevices 51 beneath them and along the sidewalls of gate 38. Crevices 51 are the chief cause of problems associated with depositing material in an opening created in a relatively thin film. With overhangs 57 present, subsequent films deposited on SiGe film 56 can accumulate in crevices 51. When these subsequent films are removed in an etching step or other photolithography process, overhangs 57 function as a mask, preventing the etchant from reaching film materials trapped beneath. The materials trapped beneath overhangs 57 and in crevices 51 are thus unintentionally left behind and form what are termed "stringers". FIG. 2 shows stringers 59 trapped beneath overhangs 57 and in crevices 51 following an etching step intended to remove all films deposited on SiGe film 56. Furthermore when it becomes necessary to etch the SiGe film 56 itself. these stringers micromask and prevent etching of the SiGe trapped beneath them.

The existence of stringers during semiconductor fabrication can detrimentally affect semiconductor performance. For instance, stringers are sometimes very conductive because the film material from which they are derived is conductive, and the presence of conductive material in unintended places can affect the electrical profile and function of nearby devices.

Thus it is seen that a method is needed that will improve the ability to open certain regions on the substrate surface for further fabrication of the semiconductor. More specifically, a method is needed that will permit creating openings without the undercutting or breadloafing produced by conventional methods and that will prevent the non-ideal deposition of subsequent films.

SUMMARY OF THE INVENTION

The present invention is directed to a method for opening a semiconductor region for fabricating a heterojunction bipolar transistor. The method of the present invention results in an improvement of the ability to open certain regions on the substrate surface for further fabrication of the semiconductor. More specifically, the invention's method permits creating openings without the, undercutting or breadloafing produced by conventional methods and will aid in proper deposition of subsequent films.

According to the method of the present invention, a transistor gate is fabricated on a substrate. For example, the transistor gate can be a polycrystalline silicon gate in a FET. Thereafter, a conformal layer is deposited over the substrate and the transistor gate. For example, conformal layer can be any suitable dielectric such as silicon dioxide, silicon nitride, or a low-k dielectric. The conformal layer is then etched back so as to form spacers on the sides of the transistor gate. Subsequently, an underlying dielectric layer is formed on the substrate, the transistor gate, and the spacers on the transistor gate. The underlying dielectric layer can be, for example silicon dioxide or other suitable dielectric material such as silicon nitride or a low-k dielectric.

Next, an overcoat layer is fabricated on the underlying dielectric layer. The overcoat layer can be, for example, polycrystalline silicon. Once the overcoat layer has been formed, an opening is etched in the overcoat and underlying dielectric layers. Subsequent films can be deposited in the opening etched in the overcoat and underlying dielectric layers. For example, silicon germanium can be grown in the opening for the purpose of fabricating a silicon germanium heterojunction bipolar transistor.

DETAILED DESCRIPTION OF THE INVENTION

The present invention is directed to a method for opening a semiconductor region for fabricating a heterojunction bipolar transistor. The following description contains specific information pertaining to the, implementation of the present invention. One skilled in the art will recognize that the present invention may be implemented in a manner different from that discussed specifically in the present application. Moreover, some specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
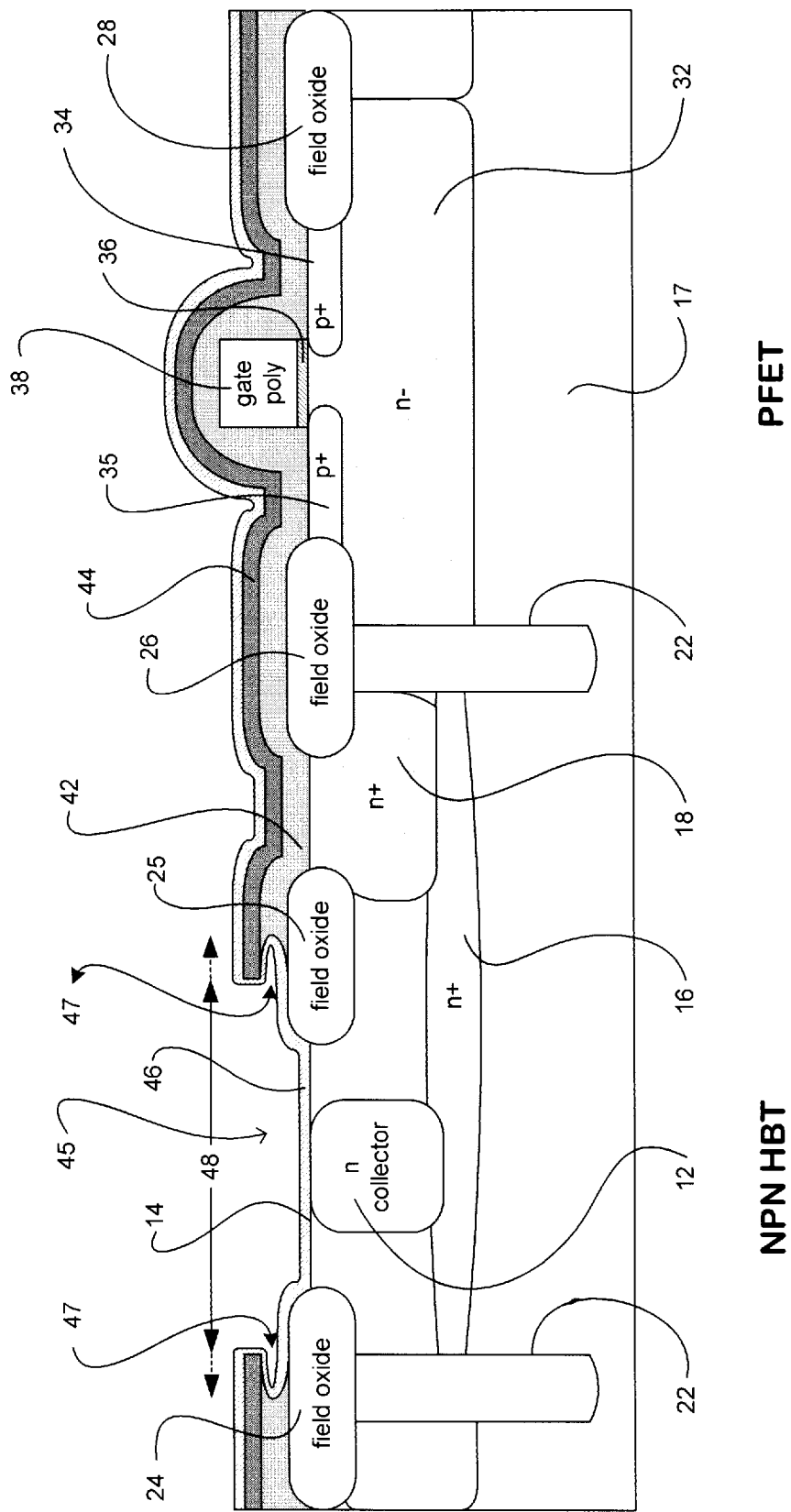
FIG. 1 illustrates a cross sectional view of a semiconductor substrate comprising features of an NPN HBT and a PFET fabricated utilizing conventional fabrication methods.
Figure 2:
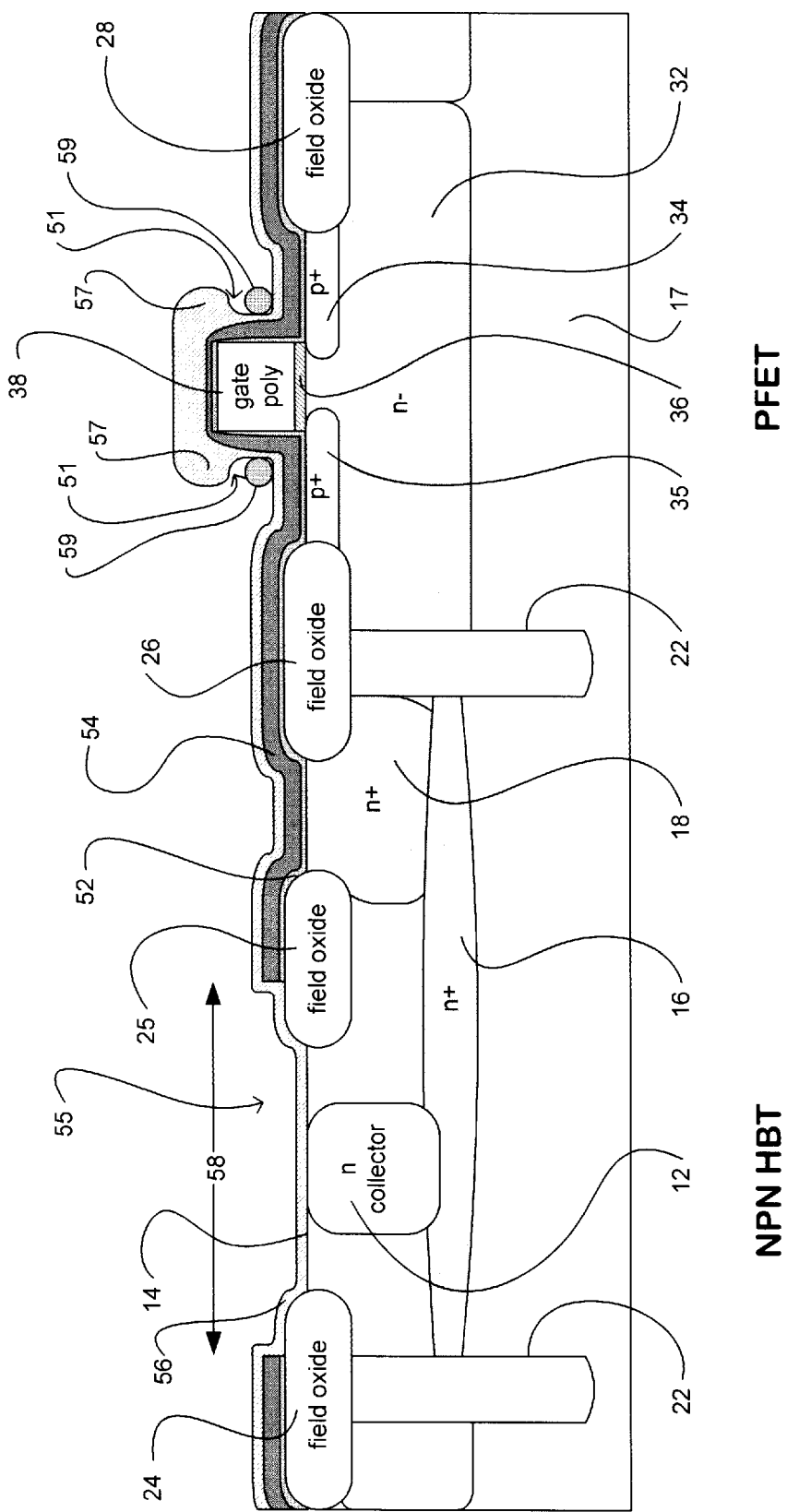
FIG. 2 illustrates a cross sectional view of a semiconductor substrate comprising features of an NPN HBT and a PFET fabricated utilizing conventional fabrication methods.
Figure 3:
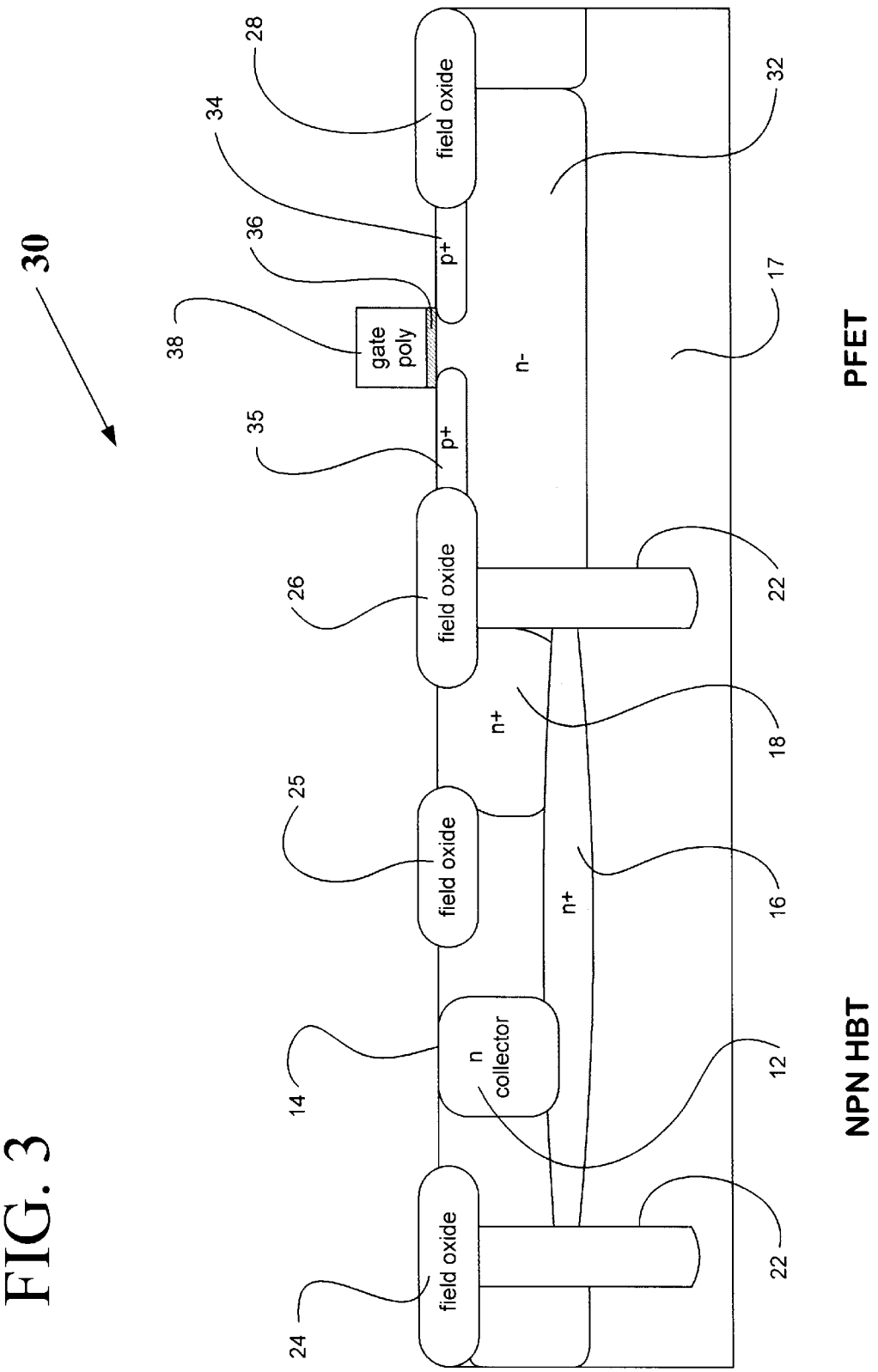
FIG. 3 illustrates a cross sectional view of a semiconductor substrate comprising features of an NPN 1IBT and a PFET in an intermediate stage of fabrication, formed in accordance with one embodiment of the present invention.

FIG. 3 shows exemplary structure 30 which is used to describe one embodiment of the present invention. Certain details and features have been left out of FIG. 3 which are apparent to a person of ordinary skill in the art. Structure 30 includes collector 12 for a silicon-germanium heterojunction bipolar transistor. Collector 12 is N-type single crystal silicon that can be formed using a dopant diffusion process in a manner known in the art. Collector 12 has a top surface 14. It is an object of one embodiment of the invention as described below to prepare top surface 14 of collector 12 for epitaxial deposition in a "reduced pressure chemical vapor deposition" ("RPCVD") process of a base comprised of P-type silicon-germanium single crystal on top surface 14 of collector 12. By the addition of base and emitter and formation of junctions and other structures in a manner known in the art, a SiGe NPN HBT is formed which includes collector 12.

As seen in FIG. 3, buried layer 16, which is composed of N+ type material, is formed in silicon substrate 17 in a manner known in the art. Collector sinker 18, also composed of N+ type material, is formed by diffusion of heavily concentrated dopants from the surface of collector sinker 18 down to buried layer 16. Buried layer 16, along with collector sinker 18, provide a low resistance electrical pathway from collector 12 through buried layer 16 and collector sink 18 to a collector contact, which is not shown. Deep trench structures 22 and field oxide structures 24, 25, 26, and 28 composed of silicon dioxide ($SiO_2$) are formned in a manner known in the art. Deep trench structures 22 and field oxide structures 24, 25, 26, and 28 provide electrical isolation from other devices on silicon substrate 17 in a manner known in the art.

Continuing with structure 30 in FIG. 3, structure 30 includes features and components of a CMOS structure, such as a P-channel field effect transistor, or PFET. on the same wafer as the NPN HBT. Structure 30 includes N well 32 for a PFET. N well 32 is N-type single crystal silicon that can be doped by ion implantation in a manner known in the art. Structure 30 further includes source 34 and drain 35 composed of P+ type material which also can be doped in a manner known in the art. Structure 30 also includes gate oxide 36 and polycrystalline silicon gate 38, both formed in a manner known in the art. By the addition of N well 32, source 34, drain 35, gate oxide 36, and gate 38, a PFET is formed on the same wafer as the NPN HPT being constructed.

Thus FIG. 3 shows that structure 30 includes several components utilized to form a SiGe HBT between field oxide 24 and field oxide 26, while structure 30 simultaneously includes several CMOS features and components such as the PFET between field oxide 26 and field oxide 28.

Figure 4:
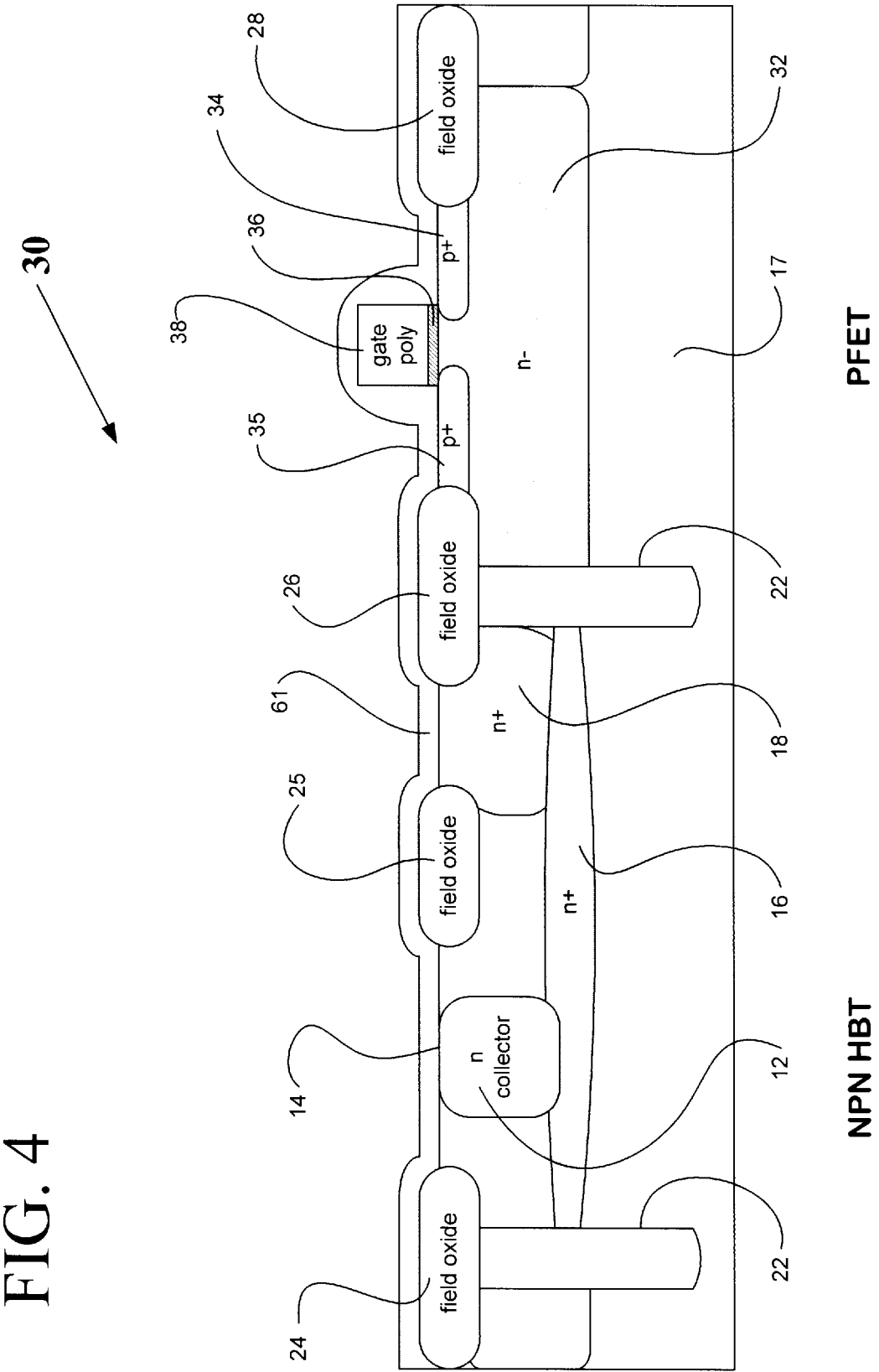
FIG. 4 illustrates a cross sectional view of a semiconductor substrate comprising features of an NPN HBT and a PFET in an intermediate stage of fabrication, formed in accordance with one embodiment of the present invention.

FIG. 4 shows the identical semiconductor region as in FIG. 3 and contains same structure 30 as in FIG. 3. According to the present embodiment of the invention conformal layer 61 has been deposited over silicon substrate 17 and its various regions such as the field oxide regions and forms a conformal film. Silicon substrate 17 is also referred to as a "semiconductor die" in the present application. It is noted that conformal layer 61 surrounds and is in contact with the perimeter sidewalls of gate 38. In the present embodiment of the invention, conformal layer 61 is $SiO_2$. However, conformal layer 61 can also be silicon nitride, a low-k dielectric, or other suitable dielectric materials known to a person of ordinary skill in the art. Conformal layer 61 can be deposited by a plasma enhanced chemical vapor deposition ("PECVD"). Conformal layer 61 deposition can also be performed by other processes in a manner known in the art. The thickness of conformal layer 61 can be, for example, approximately 2000 Angstroms.

Figure 5:
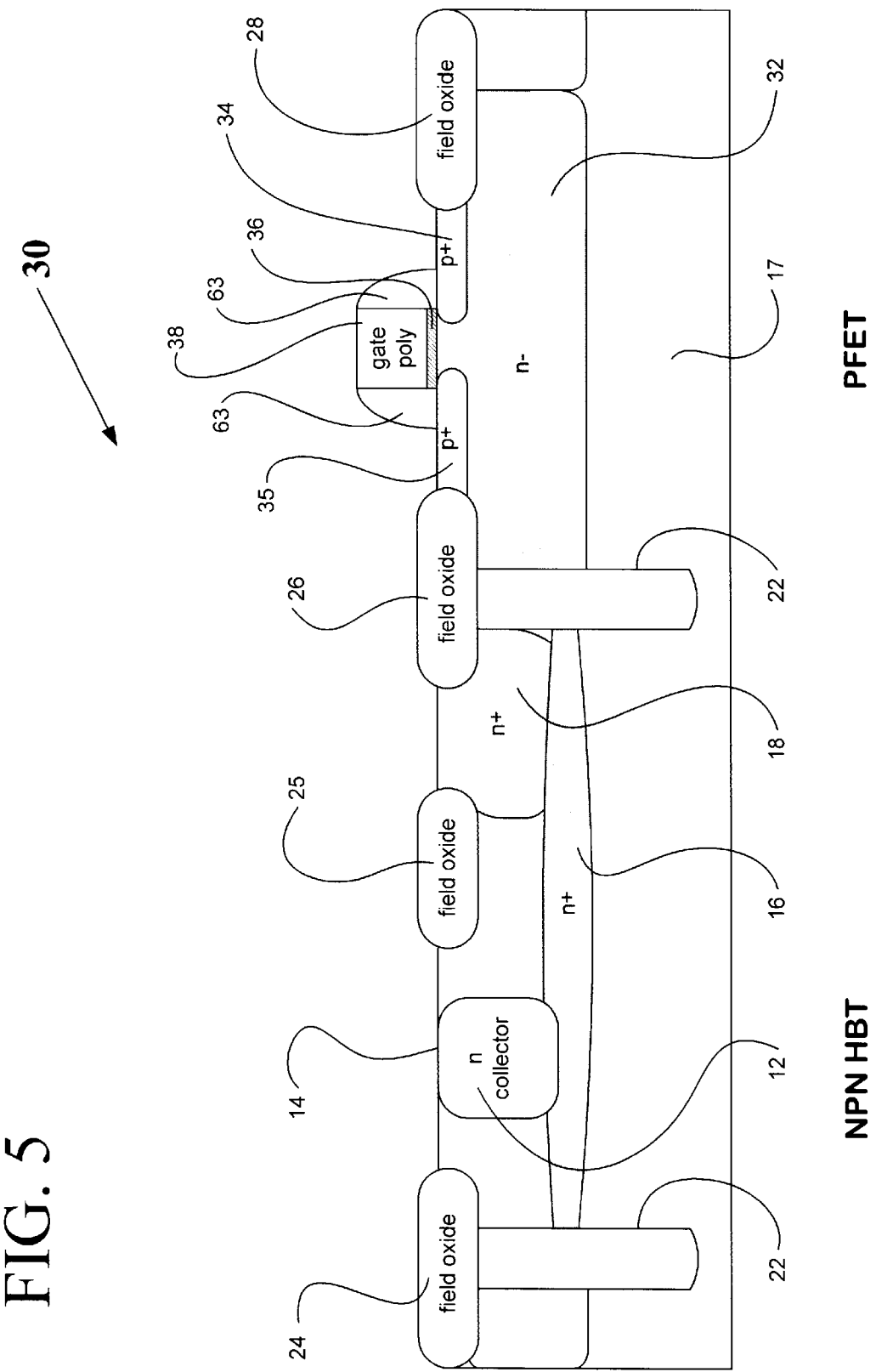
FIG. 5 illustrates a cross sectional view of a semiconductor substrate comprising features of an NPN HBT and a PFET in an intermediate stage of fabrication, formed in accordance with one embodiment of the present invention.

FIG. 5 shows the result after an etch-back process removes most of conformal layer 61 which covered structure 30 as described above. Spacers 63 are formed in the present embodiment of the invention by a blanket etch of conformal layer 61 without a mask. This blanket etch process removes almost all of conformal layer 61, leaving behind only a small residual portion which forms spacers 63 around gate 38. One benefit of spacers 63 is that they ensure the integrity of gate 38 by protecting the sidewalls of gate 38 from attack by other chemistries used in any further steps in the semiconductor chip fabrication process. A person skilled in the art will recognize that the method used to etch conformal layer 61 can be varied, as can etch time, depending on the dimensions of the gate and the spacers. The spacer width and height can be varied, for example, by changing the thickness of conformal layer 61 and the amount of spacer overetch. It is noted that spacers 63 shore up to gate 38, forming a smooth profile around gate 38.

Figure 6:
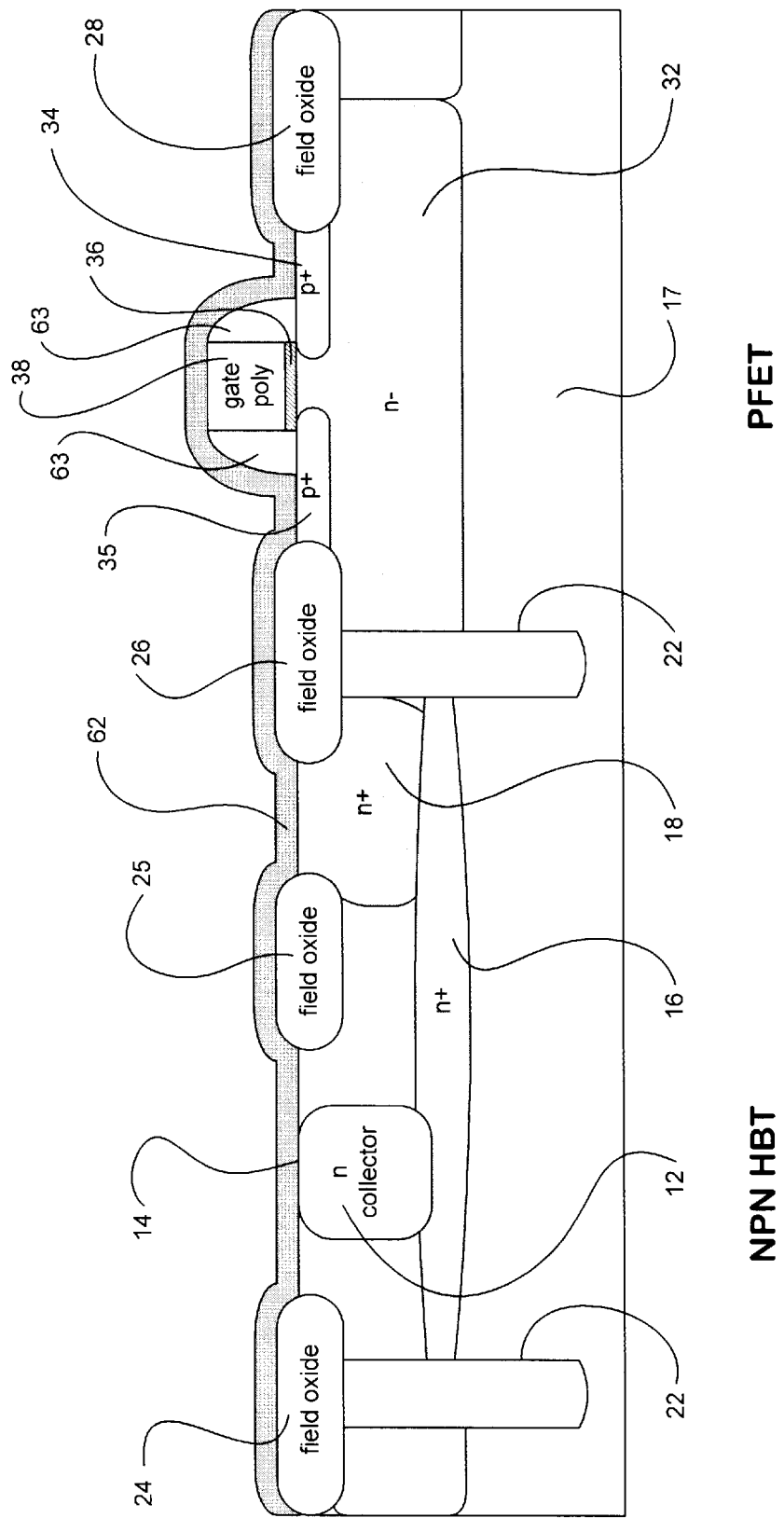
FIG. 6 illustrates a cross sectional view of a semiconductor substrate comprising features of an NPN HBT and a PFET in an intennediate stage of fabrication, formed in accordance with one embodiment of the present invention.

FIG. 6 shows that dielectric layer 62 has been fonmed over silicon substrate 17 and its various regions in a manner known in the art. Dielectric layer 62 is also referred to as an"underlying dielectric layer" in the present application and can be any suitable dielectric, for example silicon dioxide, silicon nitride or a low-k dielectric. Dielectric layer 62 deposits confonnally over the substrate surface and can be between approximately 1000 Angstroms and approximately 2000 Angstroms thick. In the present embodiment, dielectric layer 62 is necessary for proper electrical functioning of the various devices in structure 30. Dielectric layer 62 also protects device structures from attack by other chemistries and etchants that may be used in a later step in fabricating the semiconductor die.

Continuing with FIG. 6, dielectric layer 62 is relatively thin, measuring approximately 100 to 500 Angstroms. In one conventional method described above, the formation of such a thin dielectric layer on devices on a semiconductor can produce problems. One problem is the inability of the thin dielectric layer to wrap around an existing transistor gate properly or sufficiently. But in the present embodiment of the invention, dielectric layer 62 forms smoothly around gate 38, because underlying spacers 63 provide a smooth slope.

Figure 7:
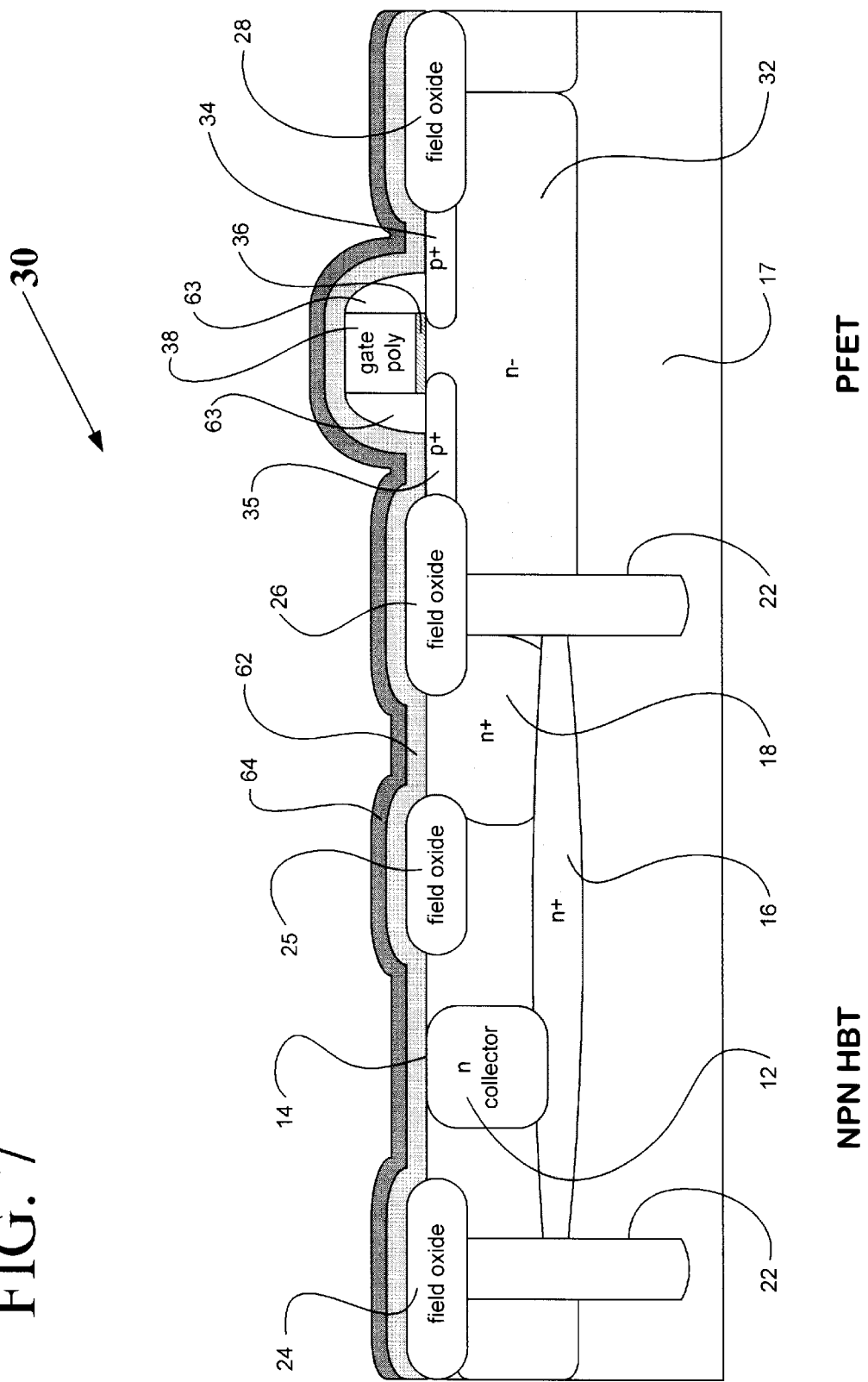
FIG. 7 illustrates a cross sectional view of a semiconductor substrate comprising features of an NPN HBT and a PFET in an intermediate stage of fabrication, formed in accordance with one embodiment of the present invention.

FIG. 7 shows the fabrication of overcoat layer 64 on structure 30. Overcoat layer 64 can be a dielectric or other materials, for example polycristalline silicon, and is deposited in a manner known in the art. The addition of overcoat layer 64 provides a number of functions such as serving as a buffer between dielectric layer 62 and any material deposited subsequently. For example, it is contemplated in the present embodiment of the invention that SiGe will be grown on overcoat layer 64, and overcoat layer 64 prevents the SiGe from coming in contact with dielectric layer 62. Often, dielectric layer 62 is $SiO_2$, which is not compatible with SiGe. It is therefore sometimes important to have an intermediate layer of material that prevents unwanted interactions between dielectric layer 62 and subsequent materials, such as SiGe. Again, FIG. 7 shows that overcoat layer 64 is conformal and deposits evenly on underlying dielectric layer 62. Overcoat layer 64 also slopes smoothly over gate 38. This smooth deposition is possible because spacers 63 form a smooth slope around gate 38.

Figure 8:
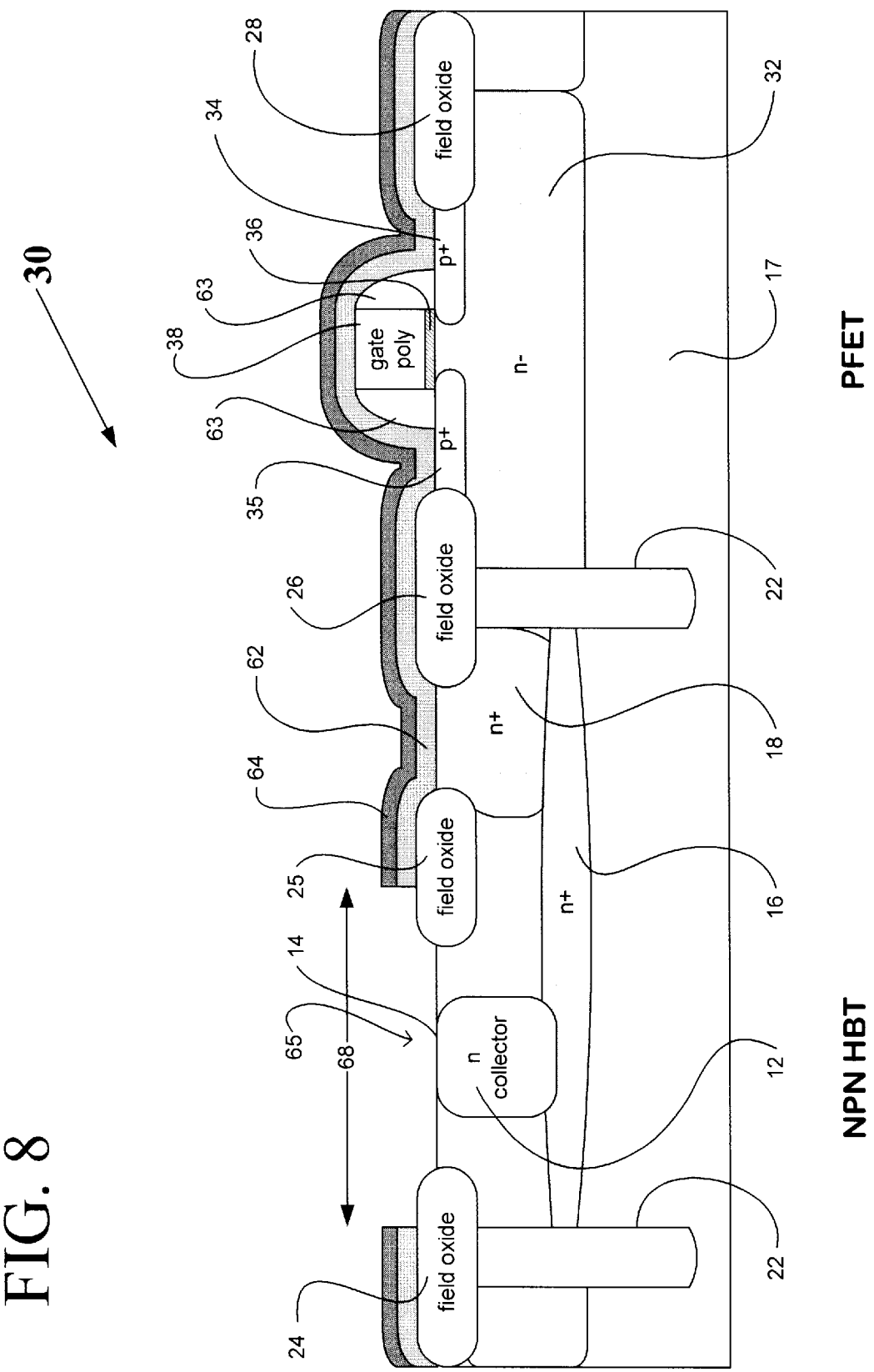
FIG. 8 illustrates a cross sectional view of a semiconductor substrate comprising features of an NPN HBT and a PFET in an intermediate stage of fabrication, formed in accordance with one embodiment of the present invention.
Figure 9:
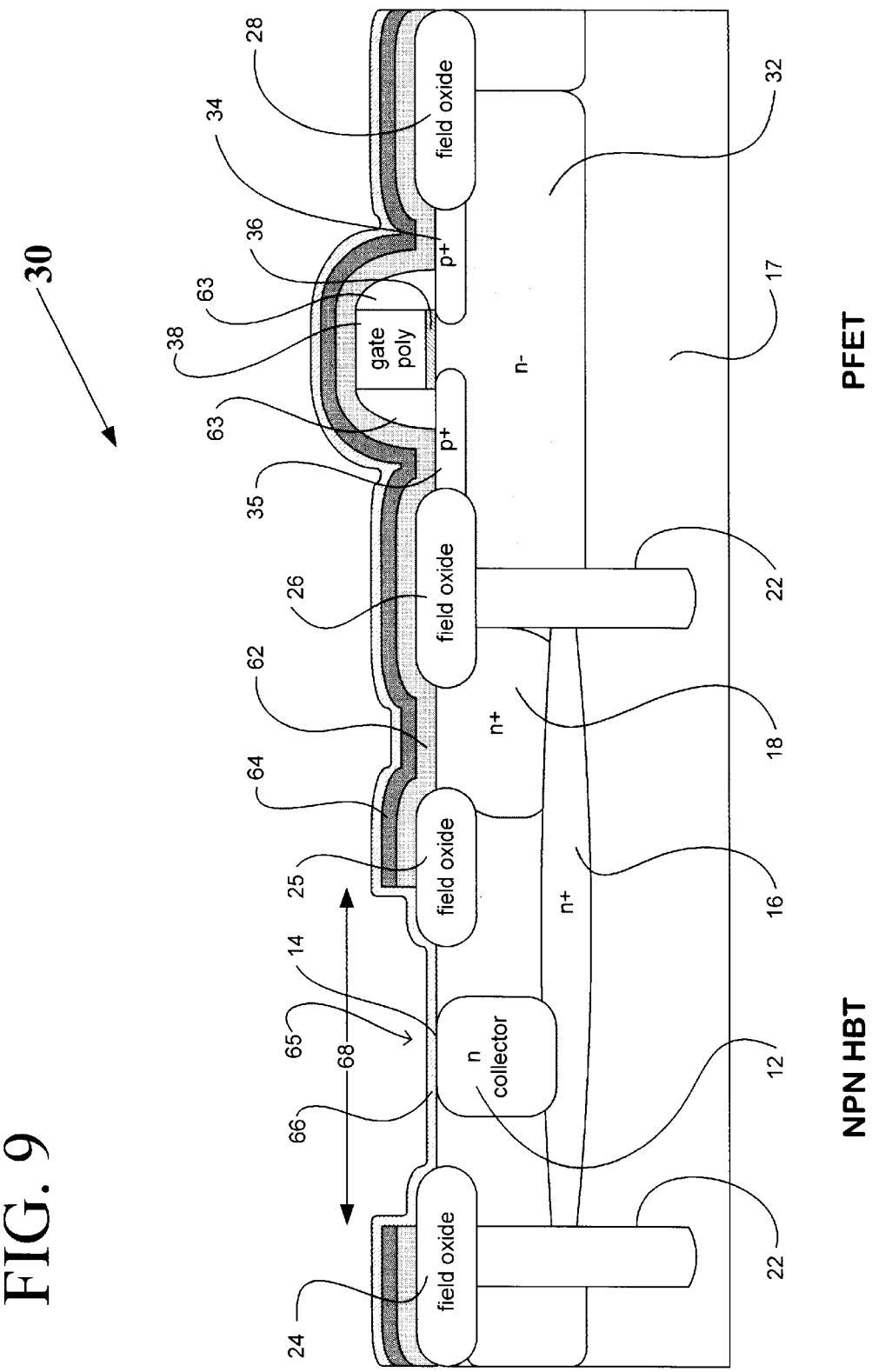
FIG. 9 illustrates a cross sectional view of a semiconductor substrate comprising features of an NPN HBT and a PFET in an intermediate stage of fabrication, formed in accordance with one embodiment of the present invention.

FIG. 8 shows the result of a masking and etching step that creates opening 65 with width 68 in dielectric layer 62 and overcoat layer 64. Etching can be done by patterning suitable photoresist over the needed site followed by an HF wet etch, or by other methods known in the art. As stated above, in the present embodiment, dielectric layer 62 is SiO$_2$ and can be in the range of approximately 100 to 500 Angstroms thick. This relative thinness means minimal undercutting of dielectric layer 62 occurs during etching, and the dimensions of opening 65, most importantly width 68. can be controlled more precisely. FIG. 9 shows SiGe film 66 grown on overcoat layer 64 and in opening 65 with width 68. The step of growing SiGe film 66 in opening 65 is also referred to as a step of growing a "desired material" in the present application. A person skilled in the art will recognize that other materials besides SiGe could be grown or deposited in opening 65, depending on the purpose for such a deposit. FIG. 9 further shows that the SiGe does not "breadloaf" on gate 38 because spacers 63, dielectric layer 62, and overcoat layer 64 form a smooth slope over the profile of gate 38. The smooth slope allows SiGe film 66 to grow smoothly over gate 38 as well. The smooth growth of SiGe layer 66 on gate 38 stops the development of overhangs and breadloafing that occurs with creating an opening in a relatively thin film of material using a conventional method. Also eliminated are the crevices that accompany the breadloafing and the threat, therefrom, of stringers accumulating on the semiconductor surface.

Figure 10:
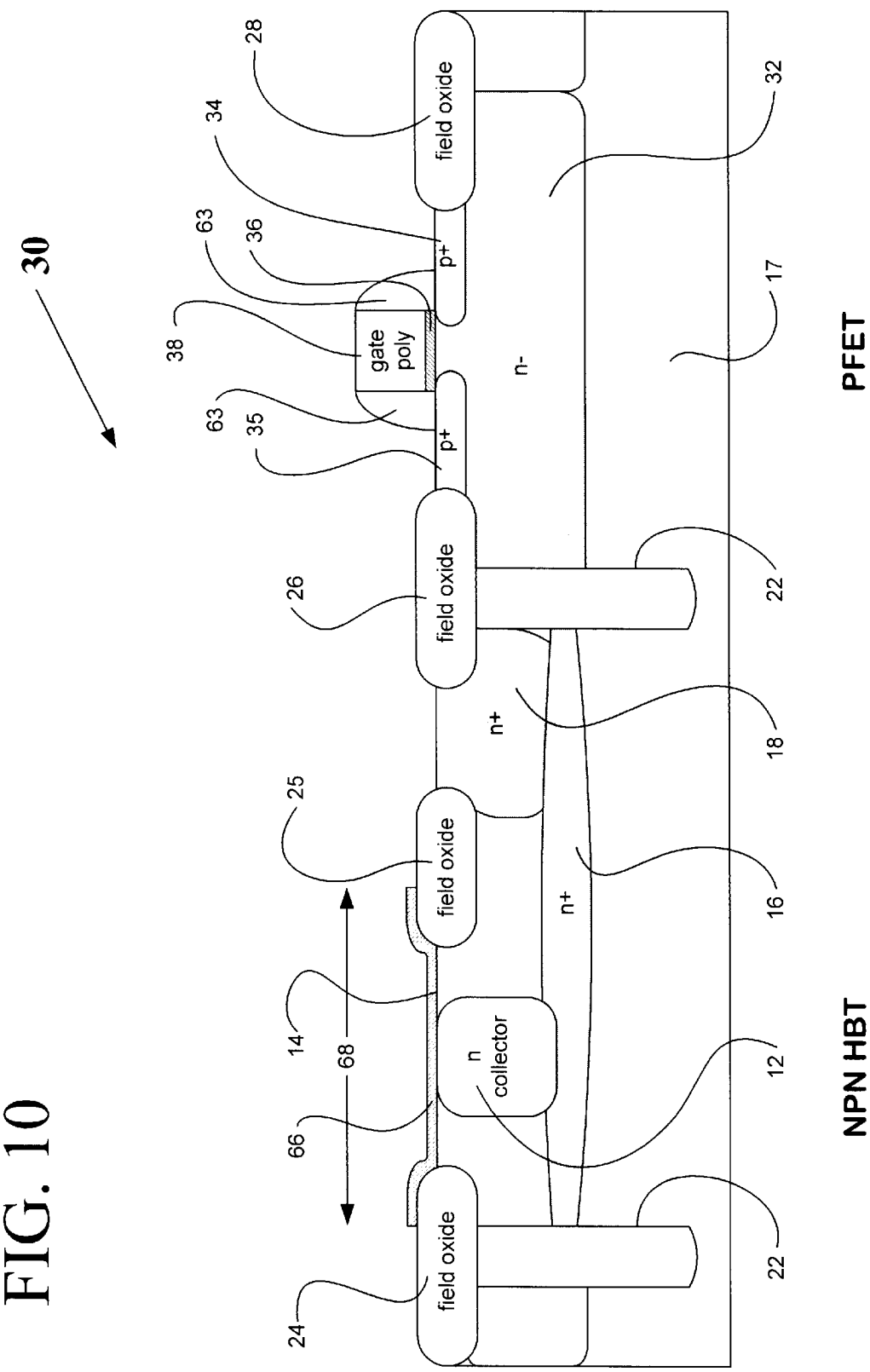
FIG. 10 illustrates a cross sectional view of a semiconductor substrate comprising features of an NPN HBT and a PFET in an intermediate stage of fabrication, formed in accordance with one embodiment of the present invention.

FIG. 10 shows the result of a mask and etch step that selectively removes most of SiGe layer 66 and leaves intact that portion of SiGe layer 66 formed in opening 65. In the present embodiment of the invention, the remaining SiGe will serve as a base for a SiGe HBT. Subsequent etching processes, for example using an HF wash, can be used to remove unwanted dielectric layer 62 and overcoat layer 64. Further, by controlling etch time. spacers 63 are minimally affected by the etchants that remove SiGe layer 66, overcoat layer 63 and dielectric layer 62. It is seen that proper control of etch time means that spacers 63 can retain their full size.

FIG. 10 thus shows the end-result of a method that permits the opening of a region on the substrate surface for the purpose of growing another material, such as the SiGe for a SiGe HBT. This method of creating the opening prevents the non-ideal formation of materials deposited subsequent to creation of the opening.

From the description above of the invention it is evident that various techniques can be used for implementing the concepts of the present invention without departing from its scope and spirit. For example, although the description has detailed the growing of silicon-germanium for a HBT, deposition of other films would also benefit from this invention. Moreover, while the invention has been described with specific references to conformal film 62 made of SiO$_2$, a person skilled in the art would recognize that other dielectrics such as silicon nitride or low-k dielectrics could serve the same purpose. The described embodiments are to be considered in all respects as illustrative and not restrictive. It should also be understood that the invention is not limited to the particular embodiments described herein, but is capable of many arrangements, modifications, and substitutions without departing from the scope of the invention.

Thus, a method for opening a semiconductor region for fabricating a heterojunction bipolar transistor has been described.

What is claimed is:

1. A method comprising steps of:
    fabricating a transistor gate on a substrate;
    depositing a conformal layer on said substrate;
    etching back said conformal layer so as to form a spacer, said spacer being situated adjacent to said transistor gate;
    forming an underlying dielectric layer on said spacer and said substrate, said underlying dielectric layer having a thickness, said underlying dielectric layer being in contact with said spacer and said substrate;
    fabricating an overcoat layer on said underlying dielectric layer;
    etching an opening in said overcoat layer and said underlying dielectric layer, wherein said thickness is selected so as to reduce undercutting of said underlying dielectric layer during said step of said etching said opening.

2. The method of claim 1 wherein said conformal layer comprises a dielectric.

3. The method of claim 1 wherein said conformal layer comprises silicon dioxide.

4. The method of claim 1 wherein said conformal layer comprises silicon nitride.

5. The method of claim 1 wherein said conformal layer comprises a low-k dielectric.

6. The method of claim 1 wherein said underlying dielectric layer comprises silicon dioxide.

7. The method of claim 1 wherein said underlying dielectric layer comprises silicon nitride.

8. The method of claim 1 wherein said overcoat layer comprises polycrystalline silicon.

9. The method of claim 1 wherein said overcoat layer comprises a dielectric.

10. The method of claim 1 further comprising a step of growing a desired material in said opening after said step of etching said opening.

11. The method of claim 10 wherein said desired material comprises silicon germanium.

12. A method for fabricating an HBT and a HET in a semiconductor die, said method comprising steps of:
    manufacturing a gate for said FET on a substrate;
    fabricating a first spacer and a second spacer, said first and second spacers being formed on respectively first and second sides of said gate;
    forming an underlying dielectric layer over said gate, said first and second spacers, and said substrate, said underlying dielectric layer having a thickness, said underlying dielectric layer being in contact with said first and second spacers and said substrate;
    etching an opening in an HBT region in said underlying dielectric layer, wherein said thickness is selected so as to reduce undercutting of said underlying dielectric layer during said step of said etching said opening;
    growing a desired material in said opening so as to form a base for said HBT.

13. The method of claim 12 further comprising a step of fabricating an overcoat layer over said underlying dielectric layer after said forming step.

14. The method of claim 13 wherein said overcoat layer comprises polycrystalline silicon.

15. The method of claim 13 wherein said overcoat layer comprises a dielectric.

16. The method of claim 13 wherein said overcoat comprises silicon dioxide.

17. The method of claim 13 wherein said overcoat comprises silicon nitride.

18. The method of claim 13 wherein said overcoat comprises a low-k dielectrics.

19. The method of claim 12 wherein said gate comprises polycrystalline silicon.

20. The method of claim 12 wherein said first spacer and said second spacer comprise a dielectric.

21. The method of claim 12 wherein said first spacer and said second spacer comprise silicon dioxide.

22. The method of claim 12 wherein said first spacer and said second spacer comprise silicon nitride.

23. The method of claim 12 wherein said dielectric layer comprises silicon dioxide.

24. The method of claim 12 wherein said dielectric layer comprises silicon nitride.

25. The method of claim 12 wherein said dielectric layer comprises a low-k dielectric.

26. The method of claim 12 wherein said step of fabricating said first spacer and said second spacer comprises:

depositing a conformal layer on, said semiconductor die; and etching back said conformal layer on said semiconductor die so as to form said first spacer and said second spacer on respectively said first and said second sides of said gate.

27. The method of claim 26 wherein said conformal layer comprises a dielectric.

28. The method of claim 26 wherein said conformal layer comprises silicon dioxide.

29. The method of claim 26 wherein said conformal layer comprises silicon nitride.

30. The method of claim 12 wherein said desired material comprises silicon germanium.

* * * * *